(12) United States Patent
Guo et al.

(10) Patent No.: US 11,949,027 B2
(45) Date of Patent: Apr. 2, 2024

(54) SOLAR MODULE

(71) Applicants: ZHEJIANG JINKO SOLAR CO., LTD., Zhejiang (CN); JINKO SOLAR CO., LTD., Jiangxi (CN)

(72) Inventors: Zhiqiu Guo, Zhejiang (CN); Guohui Hao, Zhejiang (CN); Shiliang Huang, Zhejiang (CN); Ningbo Zhang, Zhejiang (CN); Hengshuo Zhang, Zhejiang (CN)

(73) Assignees: ZHEJIANG JINKO SOLAR CO., LTD., Zhejiang (CN); TINKO SOLAR CO., LTD., Jiangxi (CN)

( * ) Notice: Subject to any disclaimer, the term of this patent is extended or adjusted under 35 U.S.C. 154(b) by 0 days.

(21) Appl. No.: 17/988,319

(22) Filed: Nov. 16, 2022

(65) Prior Publication Data
US 2023/0223481 A1 Jul. 13, 2023

(30) Foreign Application Priority Data

Jan. 13, 2022 (CN) .......................... 202210037606.7

(51) Int. Cl.
*H01L 31/02* (2006.01)
*H01L 31/0224* (2006.01)
*H01L 31/05* (2014.01)

(52) U.S. Cl.
CPC .. *H01L 31/0201* (2013.01); *H01L 31/022433* (2013.01); *H01L 31/0508* (2013.01)

(58) Field of Classification Search
CPC ......... H01L 31/0201; H01L 31/022433; H01L 31/0508
See application file for complete search history.

(56) References Cited

U.S. PATENT DOCUMENTS 9,978,899 B2 5/2018 Kim et al.
10,164,130 B2 12/2018 Choi et al.
(Continued)

FOREIGN PATENT DOCUMENTS

CN 112234109 A 1/2015
CN 204885175 U 12/2015
(Continued)

OTHER PUBLICATIONS

Office Action received on Application No. GB2217429.6 dated Jan. 12, 2023 in 8 pages.
(Continued)

*Primary Examiner* — Tae-Sik Kang
(74) *Attorney, Agent, or Firm* — Knobbe, Martens, Olson & Bear, LLP

(57) ABSTRACT

The present disclosure discloses a solar module, including solar cells and electrode lines. Each of the solar cells includes a solar cell substrate and a plurality of busbars located on one side of the solar cell substrate. Each of the electrode lines has one end connected to the busbar on a front surface of one solar cell, and the other end connected to the busbar on a rear surface of another solar cell adjacent to the one cell sheet. First electrode pads are provided at each busbar, a number of the first electrode pads ranges from 6 to 12. A relation between a diameter of the electrode line and a number of busbars is $2.987x^{-1.144}-1.9<y<3.2742x^{-1.134}+1.7$, where x denotes the diameter of the electrode line, and y denotes the number of busbars.

16 Claims, 4 Drawing Sheets

(56) References Cited

U.S. PATENT DOCUMENTS

| | | | |
|---|---|---|---|
| 2014/0124014 A1* | 5/2014 | Morad | H01L 31/042 |
| | | | 136/246 |
| 2016/0093752 A1* | 3/2016 | Kim | H01L 31/0504 |
| | | | 136/244 |
| 2016/0118523 A1 | 4/2016 | Kim et al. | |
| 2018/0138344 A1 | 5/2018 | Barr et al. | |
| 2018/0269345 A1 | 9/2018 | Cho et al. | |

FOREIGN PATENT DOCUMENTS

| | | | |
|---|---|---|---|
| CN | 106229356 A | 12/2016 |
| CN | 108229007 A | 6/2018 |
| CN | 208256683 U | 12/2018 |
| CN | 209216999 U | 8/2019 |
| CN | 110739356 A | 1/2020 |
| CN | 111370505 A | 7/2020 |
| CN | 211428184 U | 9/2020 |
| CN | 211957654 U | 11/2020 |
| CN | 112420853 A | 2/2021 |
| CN | 212659550 U | 3/2021 |
| CN | 213988902 U | 8/2021 |
| CN | 113725307 A | 11/2021 |
| CN | 215600379 U | 1/2022 |
| EP | 3331028 A1 | 6/2018 |
| JP | 62042468 A | 2/1987 |
| JP | 11243224 A | 9/1999 |
| JP | 2015058468 A | 3/2015 |
| JP | 2018125317 A | 8/2018 |
| JP | 2020072271 A | 5/2020 |
| KR | 10-2019-0032584 A | 3/2019 |
| WO | 2014020674 A1 | 2/2014 |
| WO | 2014083846 A1 | 6/2014 |
| WO | 2017179523 A1 | 10/2017 |
| WO | 2020/201290 A1 | 10/2020 |
| WO | 2021043918 A1 | 3/2021 |
| WO | 2021/063008 A1 | 4/2021 |
| WO | 2021/232723 A1 | 11/2021 |

OTHER PUBLICATIONS

Office Action for Japanese Application No. 2022-161194, dated Jan. 31, 2023, in 6 pages.
Office Action in Chinese Application No. 2022100376067, dated Apr. 16, 2023.
Notice of Correction, AOF 37402022.
Notice of Allowance in Austrian Application No. 1B GM 94/2022-2, dated Aug. 8, 2023 in 8 pages.
First Office Action in Australian Application No. 2022268276, dated Sep. 5, 2023 in 4 pages.
Second Office Action in Chinese Application No. 202210037606.7, dated Jul. 30, 2023 in 8 pages.
Notice of Rejection for JP Application No. JP-2022-161194 dated Sep. 26, 2023.
Extended European Search Report for EP Application No. 22206996.5, dated Oct. 13, 2023.
Search Report for NL Application No. 203360, dated Nov. 3, 2023.

* cited by examiner

SOLAR MODULE

CROSS REFERENCE

This application claims priority to Chinese Patent Application No. 202210037606.7, filed on Jan. 13, 2022, the disclosure of which is incorporated herein by reference in its entirety.

TECHNICAL FIELD

The present disclosure relates to the technical field of photovoltaics, and in particular, to a solar module.

BACKGROUND

A solar module is a core component of a photovoltaic power generation system, with a function of converting light energy into electric energy. The solar module is formed by connecting and encapsulating monolithic solar cells in series. The module can obtain a high voltage through series connection, and obtain a high current through parallel connection between multiple strings of solar cells. In an existing solar module, busbars are generally soldered with an electrode line to be corrected in series with the solar cells. The electrode line is soldered with electrode pads on the solar cells to play a role of electrical connection. However, the electrode pads on the solar cells may occlude surfaces of photovoltaic cells, which accordingly affects light absorption of the photovoltaic cells and then affects efficiency of the photovoltaic cells.

SUMMARY

In some aspects, the techniques described herein relate to a solar module, including: solar cells and electrode lines, wherein each of the solar cells includes a solar cell substrate and a plurality of busbars located on one side of the solar cell substrate, wherein each of the electrode lines has an end connected to a busbar of the plurality of busbars on a front surface of one solar cell of the solar cells and another end connected to the busbar on a rear surface of another solar cell of the solar cells that is adjacent to the one solar cell, wherein first electrode pads are provided at the busbar, a number of the first electrode pads ranges from 6 to 12, and wherein a relation between a diameter of each of the electrode lines and a number of the plurality of busbars is $2.987x^{-1.144}-1.9 < y < 3.2742x^{-1.134}+1.7$, where x denotes the diameter of each of the electrode lines and y denotes the number of the plurality of busbars.

In some aspects, the techniques described herein relate to a solar module, wherein the first electrode pads include first sub-electrode pads and second sub-electrode pads, wherein each of the first sub-electrode pads is located at an end of the busbar, and wherein each of the first sub-electrode pads has a length ranging from 0.5 mm to 0.8 mm in a direction perpendicular to the electrode lines, and each of the first sub-electrode pads has a width ranging from 0.5 mm to 1.2 mm in a direction parallel to the electrode lines.

In some aspects, the techniques described herein relate to a solar module, wherein each of the first sub-electrode pads has a length ranging from 0.6 mm to 0.7 mm in a direction perpendicular to the electrode lines, each of the first sub-electrode pads has a width ranging from 0.6 mm to 1.1 mm in a direction parallel to the electrode lines.

In some aspects, the techniques described herein relate to a solar module, wherein the length and the width of each of the first sub-electrode pads are equal.

In some aspects, the techniques described herein relate to a solar module, wherein the second sub-electrode pads are located between the first sub-electrode pads, and wherein each of the second sub-electrode pads has a length ranging from 0.05 mm to 0.5 mm in the direction perpendicular to the electrode lines, and each of the second sub-electrode pads has a width ranging from 0.4 mm to 0.8 mm in the direction parallel to the electrode lines.

In some aspects, the techniques described herein relate to a solar module, wherein each of the second sub-electrode pads has a length ranging from 0.1 mm to 0.45 mm in the direction perpendicular to the electrode lines, and wherein each of the second sub-electrode pads has a width ranging from 0.45 mm to 0.75 mm in the direction parallel to the electrode lines.

In some aspects, the techniques described herein relate to a solar module, wherein fingers are provided on the solar cell substrate and intersect with the busbar, and the fingers are electrically connected to the busbar, and Wherein in a direction perpendicular to the solar cell substrate, orthographic projections of part of each of the second sub-electrode pads on a plane of the solar cell substrate do not overlap with orthographic projections of the fingers on the plane of the solar cell substrate.

In some aspects, the techniques described herein relate to a solar module, wherein a width of the busbar is the same as a width of each of the fingers.

In some aspects, the techniques described herein relate to a solar module, wherein: widths of each of the fingers are in a range from 20 μm to 30 μm; and a number of the fingers ranges from 135 to 150.

In some aspects, the techniques described herein relate to a solar module, wherein the diameter of each of the electrode lines ranges from 0.2 mm to 0.33 mm.

In some aspects, the techniques described herein relate to a solar module, wherein the diameter of each of the electrode lines ranges from 0.22 mm to 0.28 mm.

In some aspects, the techniques described herein relate to a solar module, wherein a width of the busbar ranges from 20 μm to 50 μm.

In some aspects, the techniques described herein relate to a solar module, wherein a width of the busbar ranges from 30 μm to 40 μm.

In some aspects, the techniques described herein relate to a solar module, wherein the solar cell substrate is a P-type substrate or an N-type substrate.

In some aspects, the techniques described herein relate to a solar module, wherein the solar cell substrate is the P-type substrate, and the busbar on the rear surface is provided with second electrode pads, and a number of the second electrode pads ranges from 6 to 12, lengths of the second electrode pads are 1.5 mm, and widths of each of the second electrode pads are in a range from 2 mm to 3 mm.

In some aspects, the techniques described herein relate to a solar module, wherein the solar cell substrate is the N-type substrate, and the busbar on the rear surface is provided with second electrode pads, a number of the second electrode pads ranges from 10 to 12, lengths of the second electrode pads ranges from 0.5 mm to 0.8 mm, and widths of the second electrode pads ranges from 0.5 mm to 1.2 mm.

In some aspects, the techniques described herein relate to a solar module, wherein lengths of the second electrode pads ranges from 0.6 mm to 0.7 mm, and widths of the second electrode pads ranges from 0.6 mm to 1.1 mm.

In some aspects, the techniques described herein relate to a solar module, wherein the solar module further includes a first adhesive film material and a second adhesive film material, the solar cells are located between the first adhesive film material and the second adhesive film material, and the first adhesive film material and/or the second adhesive film material has an area density ranging from 310 g/m2 to 430 g/m2.

In some aspects, the techniques described herein relate to a solar module, wherein the solar cells have lengths and widths that are equal, ranging from 200 mm to 220 mm.

In some aspects, the techniques described herein relate to a solar module, wherein each of the first electrode pads has a shape including rectangular shape, diamond shape, circular shape, oval shape, and triangular shape or a combination thereof.

Other features of the present disclosure and advantages thereof will become clear from the following detailed description of exemplary embodiments of the present disclosure with reference to the accompanying drawings.

BRIEF DESCRIPTION OF DRAWINGS

The accompanying drawings, which are incorporated in and constitute a part of the specification, illustrate embodiments of the present disclosure and, together with the description, serve to explain the principles of the present disclosure.

DESCRIPTION OF EMBODIMENTS

Figure 1:
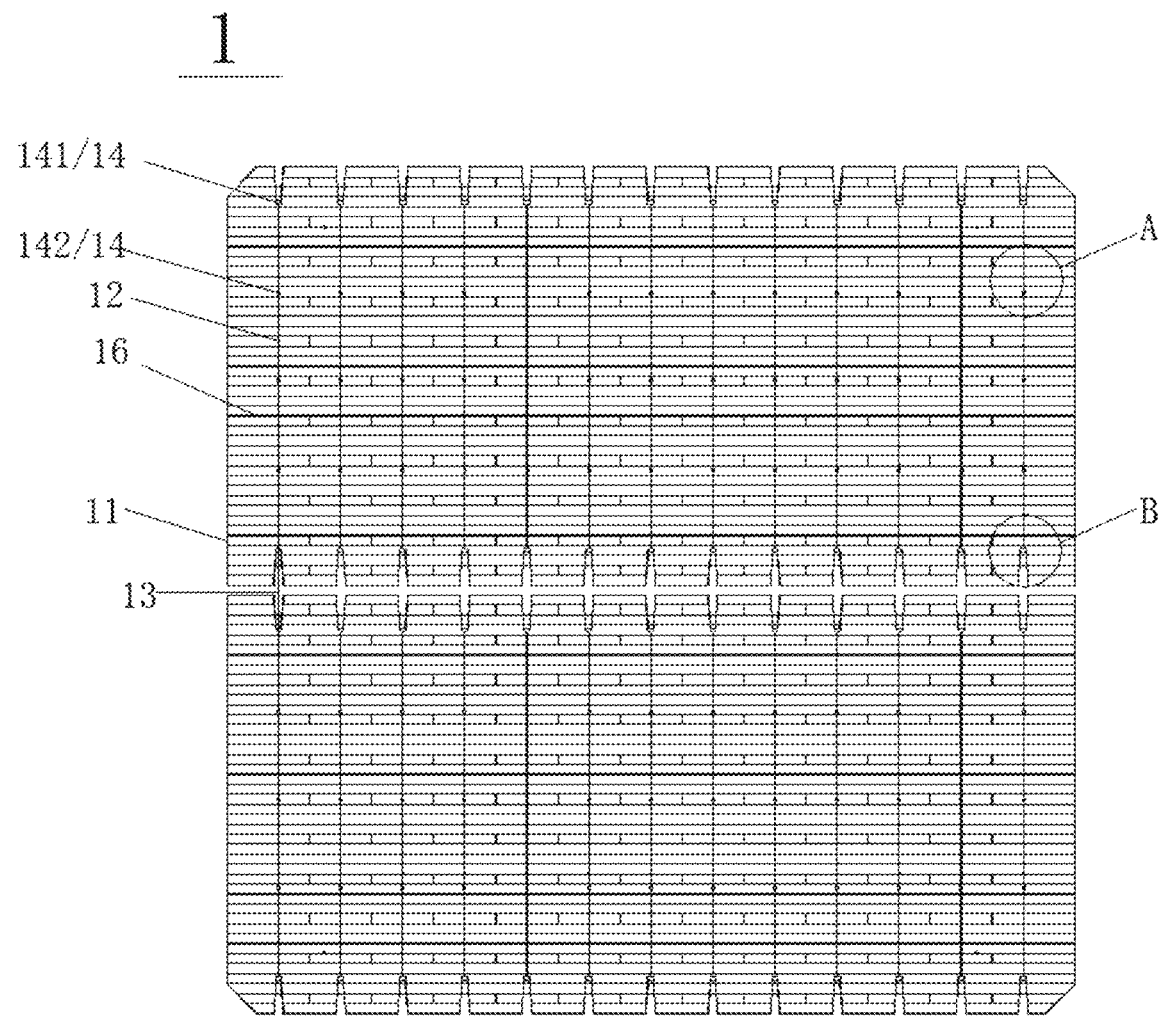
FIG. 1 is a schematic structural diagram of a front surface of a solar module according to the present disclosure.

Various exemplary embodiments of the present disclosure are now described in detail with reference to the accompanying drawings. It should be noted that, unless otherwise stated specifically, relative arrangement of the components and steps, the numerical expressions, and the values set forth in the embodiments are not intended to limit the scope of the present disclosure. The following description of at least one exemplary embodiment is in fact merely illustrative, and in no way constitutes any limitations on the present disclosure and application or use thereof. Technologies, methods, and devices known to those of ordinary skill in the related art may not be discussed in detail, but where appropriate, such technologies, methods, and devices should be considered as part of the specification.

In all the examples shown and discussed herein, any specific value should be construed as merely illustrative and not as a limitation. Therefore, other examples of exemplary embodiments may have different values.

In some embodiments, similar reference signs and letters denote similar terms in the accompanying drawings, and therefore, once an item is defined in a drawing, there is no need for further discussion in the accompanying drawings.

With the development of photovoltaic technologies, sizes of solar cells become larger and larger, corresponding currents are higher and higher, and internal losses are also increasing. In order to reduce the losses caused by the currents, the number of busbars of the solar cells is also gradually increasing. The increase in the number of busbars can effectively reduce the internal losses.

However, when the number of busbars increases to an extreme value, the power may decrease, because light is excessively occluded and a decrease in the occlusion is greater than an increase in current transmission. At the same time, consumption of silver paste is increased, thereby increasing costs.

The solar cells have become commonly used solar energy devices. The solar cells may typically be classified into N-type solar cells and P-type solar cells. When the energy is added to pure silicon (e.g., in the form of heat or light), several electrons may break off covalent bonds thereof and leave atoms. Each time an electron leaves, a hole is left. Then, the electrons wander around a lattice, looking for another hole to settle in. The electrons are called free carriers, which may carry currents. Pure silicon is mixed with phosphorus atoms, and it takes very little energy for an "extra" electron from the phosphorus atoms (outermost five electrons) to escape. When phosphorus atoms are used for doping, resulting silicon is called N-type silicon, and the solar cells are only partly N-type. The other part of silicon is doped with boron. Boron has three electrons in the outermost layer instead of four. In this way, P-type silicon can be obtained. P-type silicon has no free electrons. Solar cells of an n+/p-type structure formed by diffusing phosphorus on p-type semiconductor materials are P-type silicon wafers. Solar cells of a p+/n-type structure formed by injecting boron into N-type semiconductor materials are N-type silicon wafers.

The N-type solar cells include the N-type silicon wafers, which conduct electricity through electrons, and the P-type solar cells include the P-type silicon wafers, which conduct electricity through holes. In general, silver paste is provided on both sides of the N-type solar cells. In an embodiment, an N-type photovoltaic cell may be a Tunnel Oxide Passivated Contact (TOPCon) solar cell. A base of TOPCon solar cells is an N-type substrate.

A P-type photovoltaic cell is provided with silver paste on one side and aluminum paste and silver paste on the other side. In an embodiment, the P-type photovoltaic cell may be a Passivated Emitter and Rear Cell (PERC) solar cell. A base of the PERC solar cell is a P-type substrate.

The N-type solar cell has higher efficiency, while the P-type solar cell requires a simpler process and lower costs.

Figure 2:
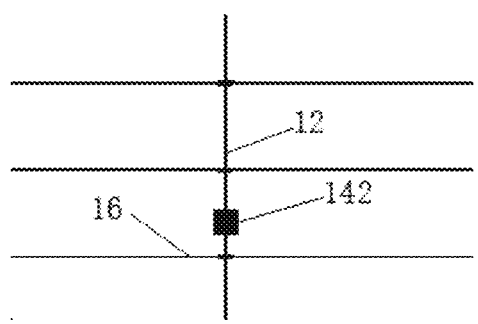
FIG. 2 is an enlarged view of A in FIG. 1.
Figure 3:
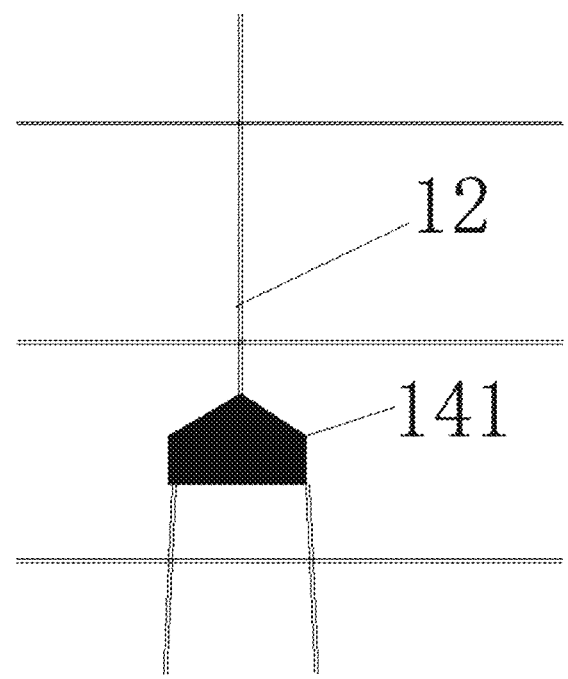
FIG. 3 is an enlarged view of B in FIG. 1.
Figure 4:
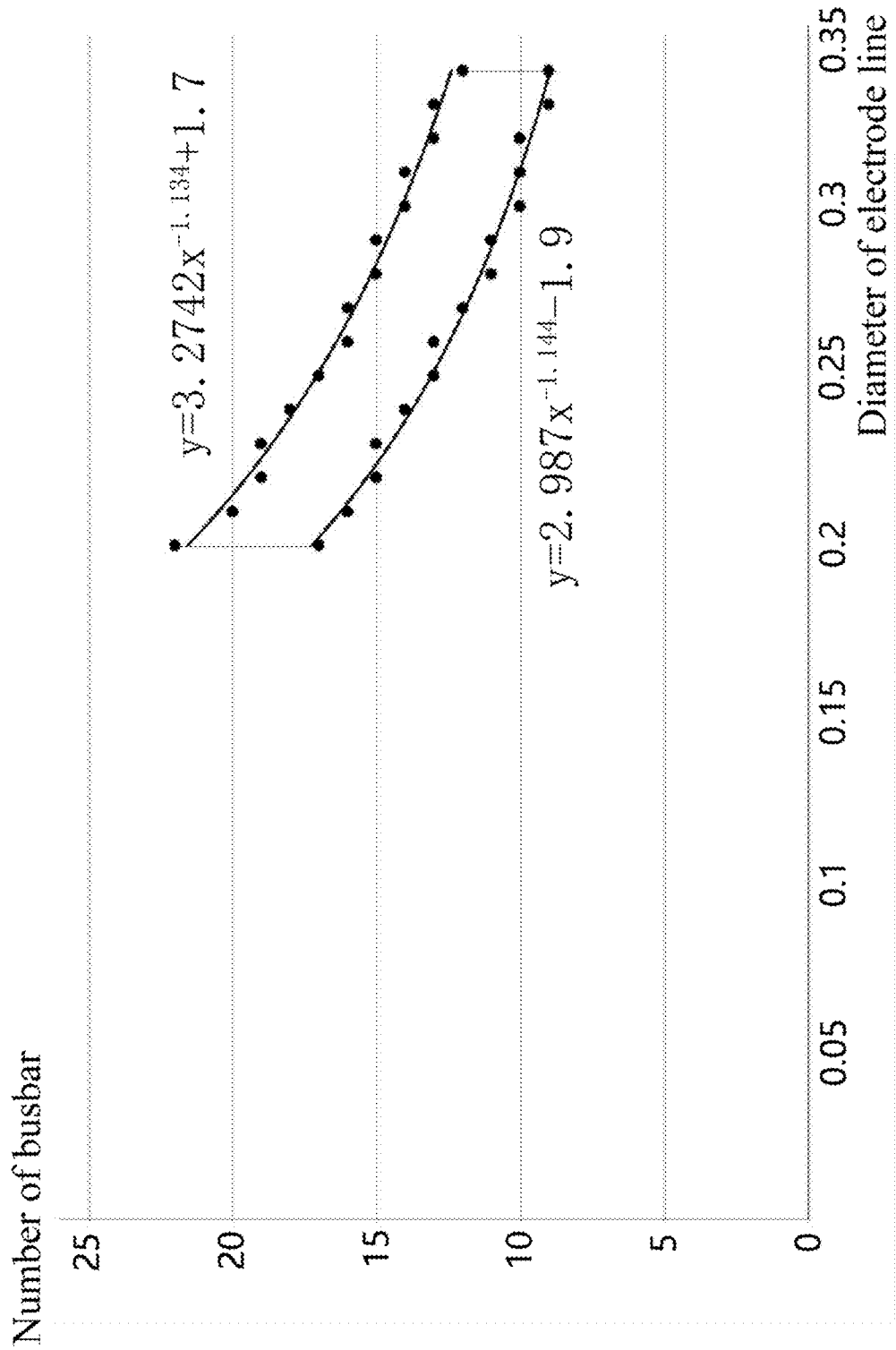
FIG. 4 is a schematic diagram of a relation between a number of busbars and a diameter of an electrode line according to the present disclosure.

Referring to FIG. 1 to FIG. 4, FIG. 1 is a schematic structural diagram of a front surface of a solar module according to the present disclosure; FIG. 2 is an enlarged view of A in FIG. 1; FIG. 3 is an enlarged view of B in FIG. 1; and FIG. 4 is a schematic diagram of a relation between the number of busbars and a diameter of an electrode line according to the present disclosure. This embodiment provides a solar module, including a plurality of solar cells 1. Each of the solar cells 1 includes a solar cell substrate 11 and a plurality of busbars 12 located on one side of the solar cell substrate 11.

The solar module further includes an electrode line 13. The electrode line 13 has one end connected to one of the plurality of busbars 12 on a front surface of the solar cell 1 and the other end connected to the busbar 12 on a rear surface of the solar cell 1.

First electrode pads 14 are provided at the busbar, and a number of the first electrode pads 14 ranges from 6 to 12.

A relation between a diameter of the electrode line 13 and the number of the plurality of busbars 12 is $2.987x^{-1.144}$–

$1.9 < y < 3.2742x^{-1.134} + 1.7$, where x denotes the diameter of the electrode line, and y denotes the number of busbars.

In an embodiment, the solar module includes solar cells 1. Each of the solar cells 1 includes a solar cell substrate 11 and a plurality of busbars 12 located on one side of the solar cell substrate 11. First electrode pads 14 are provided at each of the busbars 12, and a number of the first electrode pads 14 ranges from 6 to 12.

The solar module further includes an electrode line 13. The electrode line 13 is located between adjacent solar cells 1. One end of the electrode line 13 is connected to electrically connected to the first electrode pads 14 at a harpoon of the busbar on the front surface, and the other end of the electrode line 13 is connected to electrically connected to the first electrode pads 14 at a harpoon of the busbar on the rear surface.

In FIG. 4, the abscissa is the diameter of the electrode line 13 (in units of mm), and the ordinate is the number of busbars 12.

The present disclosure can balance costs and power of the solar module. The costs are reduced by reducing the diameter of the electrode line. The reduction of the diameter of the electrode line can reduce gram weights of adhesive films without affecting reliability of the module. However, the reduction of the diameter of the electrode line may lead to reduction of a cross-sectional area of current transmission, thereby reducing the power, so there is a need to increase the number of busbars and the number of electrode lines to increase the power. However, when the number of busbars 12 exceeds a certain value, excessive light may be occluded, and a decrease in the occlusion is greater than an increase in the current transmission, so that the power can be reduced.

In a case that power (in units of W) of a plurality of 8 to 25 busbars 12 is calculated under the same diameter of the electrode line 13, an inverted parabola may be obtained, from which the number of busbars 12 with maximum power can be obtained. If costs (in units of RMB/W) of the 8 to 25 busbars 12 are calculated under the same diameter of the electrode line 13, a cost extreme value may also be obtained. Therefore, the relation between the diameter of the electrode line 13 and the number of busbars 12 is set to $2.987x^{-1.144} - 1.9 < y < 3.2742x^{-1.134} + 1.7$, where x denotes the diameter of the electrode line, and y denotes the number of busbars. The number of busbars 12 being within a range of the two can increase the number of busbars 12, maximize the power of the solar cells, thereby helping to improve conversion efficiency of the photovoltaic cells, minimize gram weights of adhesive films while increasing the power, and reduce the costs.

In the present disclosure, the diameter of the electrode line and the number of busbars of the solar module, the power of the solar module, and the costs of the solar module are studied as follows.

TABLE 1

Relations between the diameter of the electrode line, the number of busbars of the solar module, and the power of the solar module

| Number of busbars | Diameter of the electrode line | | |
|---|---|---|---|
| | 0.2 | 0.26 | 0.33 |
| 9 | 619.50 | 631.60 | 635.40 |
| 10 | 621.30 | 633.27 | 636.20 |
| 11 | 623.06 | 634.71 | 636.90 |
| 12 | 625.87 | 635.62 | 637.58 |
| 13 | 627.9252 | 636.18 | 637.83 |

TABLE 1-continued

Relations between the diameter of the electrode line, the number of busbars of the solar module, and the power of the solar module

| Number of busbars | Diameter of the electrode line | | |
|---|---|---|---|
| | 0.2 | 0.26 | 0.33 |
| 14 | 629.46 | 636.48 | 637.80 |
| 15 | 630.63 | 636.59 | 637.58 |
| 16 | 631.51 | 636.56 | 637.21 |
| 17 | 632.17 | 636.42 | 636.74 |
| 18 | 632.65 | 636.20 | 636.18 |
| 19 | 632.99 | 635.90 | 635.56 |
| 20 | 633.23 | 635.55 | 634.89 |
| 21 | 633.36 | 635.15 | 634.19 |
| 22 | 633.42 | 634.71 | 633.44 |
| 23 | 633.41 | 634.24 | 632.68 |
| 24 | 633.34 | 633.73 | 631.88 |
| 25 | 633.24 | 633.20 | 631.07 |
| 26 | 633.08 | 632.65 | 630.25 |
| 27 | 632.88 | 632.08 | 629.41 |
| 28 | 632.66 | 631.50 | 628.55 |
| 29 | 632.40 | 630.89 | 627.69 |

As shown in Table 1, under the same electrode line diameter, as the number of busbars increases, the maximum power increases first and then decreases, which is an inverted parabola trend. For example, if the diameter of the electrode line is 0.2, the power of the solar module increases linearly when the number of busbars ranges from 9 to 22, while the power of the solar module decreases linearly when the number of busbars ranges from 23 to 29. If the diameter of the electrode line is 0.26, the power of the solar module increases linearly when the number of busbars ranges from 9 to 16, while the power of the solar module decreases linearly when the number of busbars ranges from 17 to 29. If the diameter of the electrode line is 0.33, the power of the solar module increases linearly when the number of busbars ranges from 9 to 13, while the power of the solar module decreases linearly when the number of busbars ranges from 14 to 29. Any diameter of the electrode line between 0.20 mm and 0.33 mm is measured. When the power is maximum, the diameter of the electrode line and the number of busbars conform to a condition $y \approx 2.987x^{-1.144} - 1.9$, where x denotes the diameter of the electrode line.

TABLE 2

Relations between the diameter of the electrode line, the number of busbars of the solar module, and the costs of the solar module

| Number of busbars | Diameter of the electrode line | | | |
|---|---|---|---|---|
| | 0.2 | 0.22 | 0.28 | 0.33 |
| 9 | 1.3732 | 1.3431 | 1.3345 | 1.34145 |
| 10 | 1.3715 | 1.3374 | 1.3338 | 1.3410 |
| 11 | 1.3602 | 1.3339 | 1.3322 | 1.3415 |
| 12 | 1.3515 | 1.3300 | 1.3314 | 1.3432 |
| 13 | 1.3457 | 1.3275 | 1.3315 | 1.3441 |
| 14 | 1.3398 | 1.3262 | 1.3316 | 1.3458 |
| 15 | 1.3355 | 1.3258 | 1.3328 | 1.3484 |
| 16 | 1.3327 | 1.3251 | 1.3339 | 1.3509 |
| 17 | 1.3303 | 1.3269 | 1.3366 | 1.3548 |
| 18 | 1.3299 | 1.3283 | 1.3397 | 1.3590 |
| 19 | 1.3299 | 1.3320 | 1.3428 | 1.3633 |
| 20 | 1.3303 | 1.3346 | 1.3465 | 1.3680 |

As can be seen from Table 2, under the same diameter of the electrode line, a minimum cost of the solar module can be obtained. For example, if the diameter of the electrode line is 0.2, the costs of the solar module decrease linearly when the number of busbars ranges from 9 to 18, a maximum cost 1.329 of the solar cell is obtained when 18 busbars are provided, and the cost of the solar cell may be increased when 20 busbars are provided. If the diameter of the electrode line is 0.22, the costs of the solar module decrease linearly when the number of busbars ranges from 9 to 16, a maximum cost 1.3251 of the solar cell is obtained, and the cost of the solar cell may be increased when 17 to 20 busbars are provided. If the diameter of the electrode line is 0.28, the costs of the solar module decrease linearly when 9 to 12 busbars are provided, a maximum cost 1.3314 of the solar cell is obtained, and the cost of the solar cell may be gradually increased when 13 to 20 busbars are provided. If the diameter of the electrode line is 0.33, a maximum cost 1.3410 of the solar cell is obtained when the number of busbars is 10, and the cost of the solar cell may be linearly increased when the number of busbars ranges from 11 to 20. Any diameter of the electrode line between 0.2 mm and 0.33 mm is measured. When all cost values are minimum, the diameter of the electrode line and the number of busbars conform to a condition $y \approx 3.2742x^{-1.134}+1.7$, and the value may be rounded down, where x denotes the diameter of the electrode line.

As shown in FIG. 4, a preferred number of busbars 12 is between a closed pattern enclosed by two lines $y=2.987x^{-1.144}-1.9$ and $y=3.2742x^{-1.134}+1.7$. The formulas of the present disclosure consider the number of busbars with the maximum efficiency and the number of busbars with the minimum cost, so a value between the two is taken to ensure that the power is high and the cost is not excessively high. That is, the relation between the diameter of the electrode line 13 and the number of busbars 12 is $2.987x^{-1.144}-1.9<y<3.2742x^{-1.134}+1.7$. When this condition is satisfied, the number of busbars 12 can be increased, the power of the solar cells can be maximized, thereby helping to improve conversion efficiency of the photovoltaic cells, gram weights of adhesive films can be reduced while the power is increased, and the costs can be reduced.

In some embodiments, still referring to FIG. 1 to FIG. 3, the first electrode pad 14 includes first sub-electrode pads 141 and second sub-electrode pads 142, and the first sub-electrode pads 141 are located at ends of the busbar 12, and the second sub-electrode pads 142 are located between the first sub-electrode pads 141.

Each of the first sub-electrode pads 141 has a length ranging from 0.5 mm to 0.8 mm perpendicular to the electrode line 13, the first sub-electrode pad 141 has a width ranging from 0.5 mm to 1.2 mm parallel to the electrode line 13, each of the second sub-electrode pads 142 has a length ranging from 0.05 mm to 0.5 mm perpendicular to the electrode line 13, and the second sub-electrode pad 142 has a width ranging from 0.4 mm to 0.8 mm parallel to the electrode line 13.

In an embodiment, the first electrode pad 14 includes first sub-electrode pads 141 and second sub-electrode pads 142. The first sub-electrode pads 141 may be located at harpoon shapes at two ends of the busbar 12. That is, the first sub-electrode pads 141 may be arranged on two opposite sides of the busbar 12. The second sub-electrode pads 142 are located between the first sub-electrode pads 141. The busbar 12 is a straight line, so when the first sub-electrode pads 141 are successfully soldered, positions of the busbar 12 and the electrode line 13 are also relatively fixed.

The solar cells 1 according to the embodiments of the present disclosure may be applied to a size range of 200 mm to 220 mm. The solar cells 1 have lengths and widths that are equal, ranging from 200 mm to 220 mm. In this embodiment, the solar cells are 210 mm, that is, lengths and widths are 210 mm. In general, conventional solar cells of Model 210 are mostly in half, and the busbar 12 is provided with 7 or more electrode pads. The number of the second sub-electrode pads 142 in the embodiment of the present disclosure is reduced to 3 compared with an existing solution. A spacing between adjacent second sub-electrode pads 142 may range from 18.20 mm to 22.76 mm. The first sub-electrode pad 141 has a length ranging from 0.5 mm to 0.8 mm perpendicular to the electrode line 13. In an embodiment, the length of the first sub-electrode pad 141 may be 0.5 mm, 0.6 mm, 0.7 mm, or 0.8 mm. The first sub-electrode pad 141 has a width ranging from 0.5 mm to 1.2 mm parallel to the electrode line 13. In an embodiment, the width of the first sub-electrode pad 141 may be 0.5 mm, 0.6 mm, 0.7 mm, 0.8 mm, 0.9 mm, 1.0 mm, or 1.1 mm. The length and the widths of the first sub-electrode pad 141 are equal, for example, the length of the first sub-electrode pad 141 and the width of the first sub-electrode pad 141 are both 0.5 mm, so that a contact area between the electrode line 13 and the first sub-electrode pad 141 can be increased, the solar cell 1 can be in better contact with the electrode line 13, soldering tension is increased, and a series soldering machine with high precision positioning is not required. To realize the process, there is a need to flatten the electrode line 13 corresponding to the first sub-electrode pad 141 by drawing the electrode line 13 to the solar cell 1.

The second sub-electrode pad 142 has a length ranging from 0.05 mm to 0.5 mm perpendicular to the electrode line 13. In an embodiment, the length of the second sub-electrode pad 142 is 0.1 mm, 0.15 mm, 0.2 mm, 0.25 mm, 0.3 mm, 0.35 mm, 0.4 mm, or 0.45 mm. The second sub-electrode pad 142 has a width ranging from 0.4 mm to 0.8 mm parallel to the electrode line 13. In an embodiment, the width of the second sub-electrode pad 142 is 0.45 mm, 0.5 mm, 0.55 mm, 0.6 mm, 0.65 mm, 0.7 mm, or 0.75 mm. By adjusting the number and area of the second sub-electrode pad 142, occlusion of the second sub-electrode pad 142 to the solar cell substrate 11 can be reduced, thereby helping to reduce the influence of the second sub-electrode pad 142 on light absorption of the solar cell substrate 11 and helping to improve operation efficiency of the photovoltaic cell. At the same time, the area of the second sub-electrode pad 142 is reduced, and silver paste consumed may also be reduced accordingly, thereby helping to reduce the costs.

In some embodiments, still referring to FIG. 4, the diameter of the electrode line 13 ranges from 0.2 mm to 0.33 mm.

In an embodiment, the diameter of the electrode line 13 may be 0.2 mm, 0.22 mm, 0.24 mm, 0.26 mm, 0.28 mm, 0.3 mm, 0.32 mm, or 0.33 mm. The diameter of the electrode line 13 is not specified herein, provided that the diameter ranges from 0.20 mm to 0.33 mm. The diameter of the electrode line 13 ranging from 0.2 mm to 0.33 mm can maximize the power of the solar module and minimize the costs of the solar module at the same time.

In some embodiments, still referring to FIG. 1, a width of the busbar 12 ranges from 20 μm to 50 μm. In an embodiment, the width of the busbar 12 may be 20 μm, 30 μm, 40 μm, 50 μm, or the like. In this embodiment, the diameter of the electrode line 13 is reduced by reducing the width of each busbar 12. Therefore, the number and area of the second sub-electrode pads 142 required are also relatively reduced while soldering yield and required soldering tension are ensured, thereby reducing the consumption of silver paste and helping to reduce the costs.

Figure 5:
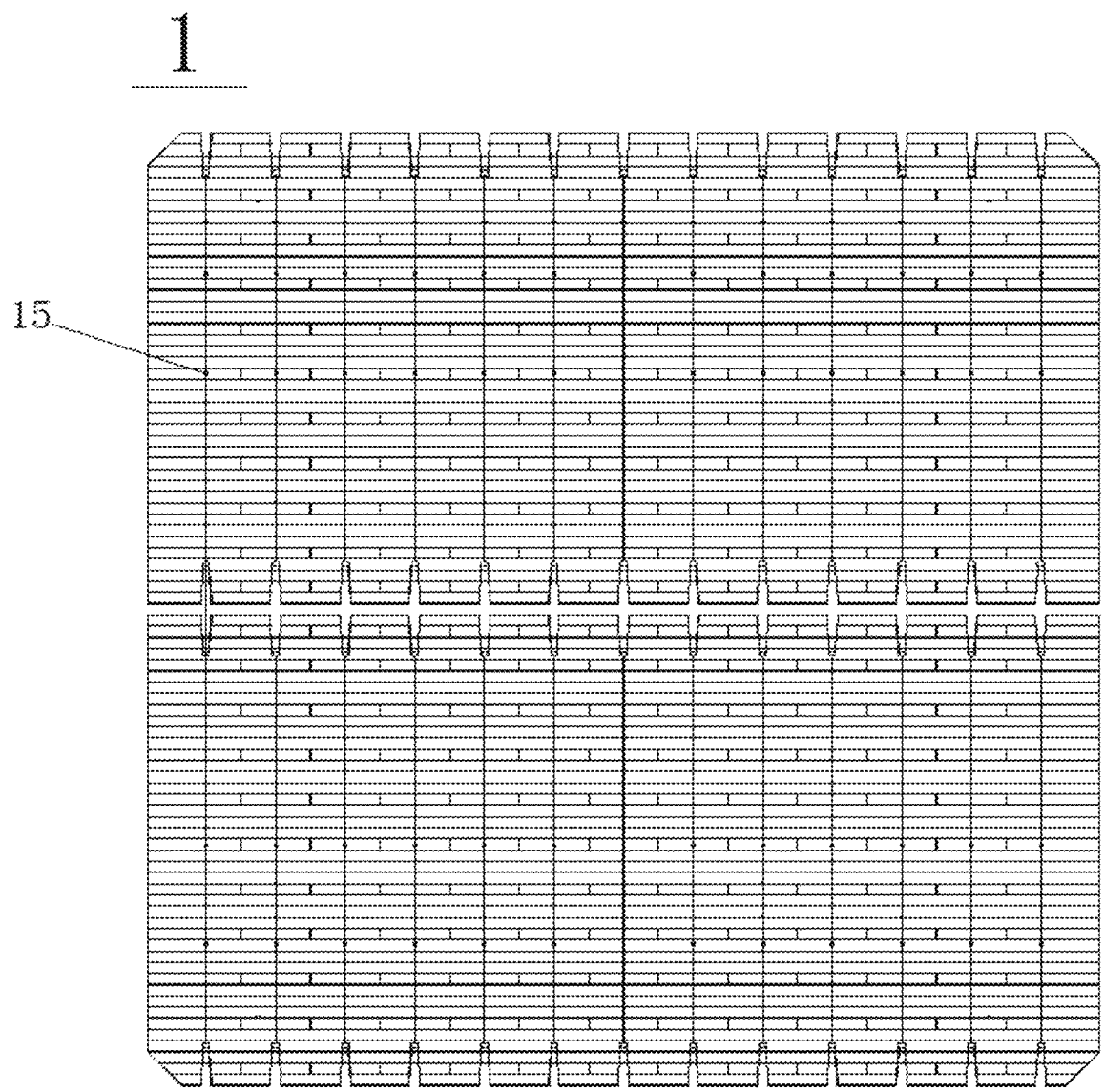
FIG. 5 is a schematic structural diagram of a rear surface of the solar module according to the present disclosure.

In some embodiments, still referring to FIG. 5, FIG. 5 is a schematic structural diagram of a rear surface of the solar module according to the present disclosure. The solar cell substrate 11 according to this embodiment is the P-type substrate, second electrode pads 15 are provided at the busbar 12 on the rear surface, a number of the second electrode pads 15 ranges from 6 to 12, lengths of the second electrode pads 15 are 1.5 mm, and widths of the second electrode pads 15 range from 2 mm to 3 mm; or the solar cell substrate 11 is the N-type substrate, second electrode pads 15 are provided at the busbar 12 on the rear surface, a number of the second electrode pads 15 ranges from 10 to 12, lengths of the second electrode pads 15 range from 0.5 mm to 0.8 mm, and widths of the second electrode pads 15 range from 0.5 mm to 1.2 mm.

In an embodiment, the solar cell substrate 11 is the P-type substrate, the second electrode pads 15 are provided at the busbar 12 on the rear surface, and the number of the second electrode pads 15 on the entire P-type substrate ranges from 6 to 12. Except the second electrode pads 15 at two ends of the busbar 12, a spacing between adjacent second electrode pads 15 ranges from 18.20 mm to 22.75 mm or from 30.33 mm to 45.50 mm. Lengths of the second electrode pads 15 are 1.5 mm, and widths of the second electrode pads 15 range from 2 mm to 3 mm. By adjusting the number and area of the second electrode pads 15 on the P-type substrate, the consumption of silver paste can be reduced, and the solar cell 1 can be in better contact with the electrode line 13 to increase soldering tension.

The solar cell substrate 11 is the N-type substrate, the second electrode pads 15 are provided at the busbar 12 on the rear surface, and the number of the second electrode pads 15 on the entire N-type substrate ranges from 10 to 12. Except the second electrode pads 15 at two ends of the busbar 12, a spacing between adjacent second electrode pads 15 ranges from 18.20 mm to 22.76 mm. Lengths of the second electrode pads 15 range from 0.5 mm to 0.8 mm, which are 0.5 mm, 0.6 mm, 0.7 mm, or 0.8 mm for example. Widths of the second electrode pads 15 range from 0.5 mm to 1.2 mm, which are 0.6 mm, 0.7 mm, 0.8 mm, 0.9 mm, 1.0 mm, or 1.1 mm for example. By adjusting the number and area of the second electrode pads 15 on the N-type substrate, the consumption of silver paste can be reduced, and the solar cell 1 can be in better contact with the electrode line 13, thereby increasing soldering tension.

In some embodiments, still referring to FIG. 1 and FIG. 2, the solar cell substrate 11 further includes fingers 16 intersecting with the busbar 12. The fingers 16 are electrically connected to the busbar 12.

In a direction perpendicular to the solar cell substrate 11, orthographic projections of part of the second electrode pads 142 on a plane of the solar cell substrate 11 do not overlap with orthographic projections of the fingers 16 on the plane of the solar cell substrate 11.

In an embodiment, the solar cell substrate 11 further includes fingers 16 intersecting with the busbar 12. The fingers 16 may be perpendicular to the busbar 12. The fingers 16 are electrically connected to the busbar 12. The fingers 16 are configured to collect currents generated by the solar cell substrate 11. The busbar 12 is configured to collect currents of the fingers 16.

In the direction perpendicular to the solar cell substrate 11, orthographic projections of part of the second electrode pads 142 on the plane of the solar cell substrate 11 do not overlap with orthographic projections of the fingers 16 on the plane of the solar cell substrate 11. That is, the second electrode pads 142 are arranged on the busbar 12, most of the second electrode pads 142 are not at junctions between the busbar 12 and the fingers 16, and only a small number of the second electrode pads 142 are arranged at the junctions between the busbar 12 and the fingers 16, which reduces electrode breakage at joints between the busbar 12 and the fingers 16 caused by soldering, thereby affecting normal use of the photovoltaic cells.

In some embodiments, still referring to FIG. 1, a width of the busbar 12 is the same as widths of the fingers 16. By reducing the width of the busbar 12, the consumption of silver paste is reduced and conversion efficiency of the module is improved.

In some embodiments, still referring to FIG. 1, widths of the fingers 16 range from 20 μm to 30 μm, and a number of the fingers 16 ranges from 135 to 150. For example, the number of the fingers 16 may be 138, 141, 144, 147, or the like. By reducing the number of the fingers 16, the consumption of silver paste and occlusion of electrodes can also be reduced.

Figure 6:
FIG. 6 is another schematic structural diagram of the solar module according to the present disclosure.

In some embodiments, referring to FIG. 6, FIG. 6 is another schematic structural diagram of the solar module according to the present disclosure. The solar module according to this embodiment further includes a first adhesive film material 2 and a second adhesive film material 3, the solar cells 1 are located between the first adhesive film material 2 and the second adhesive film material 3, and the first adhesive film material 2 and/or the second adhesive film material 3 has an area density ranging from 310 g/m$^2$ to 430 g/m$^2$. Generally, the first adhesive film material 2 and the second adhesive film material 3 are configured to bond and fix glass and the solar cells 1. The reduction of the diameter of the electrode line 13 helps to reduce gram weights of the first adhesive film material 2 and the second adhesive film material 3, so that the first adhesive film material 2 and the second adhesive film material 3 with lower gram weights can be selected when the solar module is packaged, thereby achieving a purpose of reducing packaging costs of the solar module on the premise of ensuring reliability of the solar module.

In some embodiments, still referring to FIG. 1 and FIG. 4, the first electrode pad 14 has any shape including rectangular shape, diamond shape, circular shape, oval shape, and triangular shape or a combination thereof. For example, the triangular shape can be combined with any one of the rectangular shape, the diamond shape, the circular shape, and the oval shape. Such shapes can reduce the area of the first electrode pad 14 compared with a conventional square structure of the electrode pad. The design can reduce occlusion of the base, and can also reduce consumption of silver paste and the costs.

As can be known from the above embodiments, the solar module according to the present disclosure achieves at least the following beneficial effects.

The present disclosure can balance costs and power of the solar module. The costs are reduced by reducing the diameter of the electrode line, because gram weights of the first adhesive film material and the second adhesive film material can be reduced after the diameter of the electrode line is reduced. However, the reduction of the diameter of the electrode line may lead to reduction of a cross-sectional area of current transmission, thereby reducing the power, so there is a need to increase the number of busbars and the number of electrode lines to increase the power. However, when the number of busbars exceeds a certain value, excessive light may be occluded, and a decrease in the occlusion is greater than an increase in the current transmission, so that the power can be reduced. Therefore, the relation between the diameter of the electrode line and the number of busbars is set to $2.987x^{-1.144}-1.9<y<3.2742x^{-11.134}+1.7$. The number of busbars being within a range of the two can increase the number of busbars, maximize the power of the solar cells, thereby helping to improve conversion efficiency of the photovoltaic cells, minimize gram weights of adhesive films while increasing the power, and reduce the costs.

Although some specific embodiments of the present disclosure have been described in detail through examples, it should be understood by those skilled in the art that the above examples are for illustrative purposes only and not intended to limit the scope of the present disclosure. It should be understood by those skilled in the art that the above embodiments can be modified without departing from the scope and spirit of the disclosure. The scope of the present disclosure is defined by the appended claims.

What is claimed is:

1. A solar module, comprising:
   solar cells;
   and electrode lines,
   wherein each of the solar cells comprises a solar cell substrate and a plurality of busbars located on one side of the solar cell substrate,
   wherein each of the electrode lines has an end connected to a busbar of the plurality of busbars on a front surface of one solar cell of the solar cells and another end connected to the busbar on a rear surface of another solar cell of the solar cells that is adjacent to the one solar cell,
   wherein first electrode pads are provided at the busbar, a number of the first electrode pads ranges from 6 to 12, and
   wherein a relation between a diameter of each of the electrode lines and a number of the plurality of busbars is $2.987x^{-1.144}-1.9<y<3.2742x^{-1.134}+1.7$, where x denotes the diameter of each of the electrode lines in millimeters and y denotes the number of the plurality of busbars;
   wherein the solar cells have lengths and widths that are equal, ranging from 200 mm to 220 mm;
   wherein the first electrode pads comprise first sub-electrode pads and second sub-electrode pads, and fingers are provided on the solar cell substrate and intersect with the busbar, and the fingers are electrically connected to the busbar, and wherein in a direction perpendicular to the solar cell substrate, orthographic projections of part of each of the second sub-electrode pads on a plane of the solar cell substrate do not overlap with orthographic projections of the fingers on the plane of the solar cell substrate;
   wherein the diameter of each of the electrode lines ranges from 0.2 mm to 0.33 mm; and
   wherein a width of the busbar ranges from 20 μm to 50 μm.

2. The solar module according to claim 1, wherein each of the first sub-electrode pads is located at an end of the busbar, and
   wherein each of the first sub-electrode pads has a length ranging from 0.5 mm to 0.8 mm in a direction perpendicular to the electrode lines, and each of the first sub-electrode pads has a width ranging from 0.5 mm to 1.2 mm in a direction parallel to the electrode lines.

3. The solar module according to claim 2, wherein each of the first sub-electrode pads has a length ranging from 0.6 mm to 0.7 mm in a direction perpendicular to the electrode lines, each of the first sub-electrode pads has a width ranging from 0.6 mm to 1.1 mm in a direction parallel to the electrode lines.

4. The solar module according to claim 2, wherein the length and the width of each of the first sub-electrode pads are equal.

5. The solar module according to claim 2, wherein the second sub-electrode pads are located between the first sub-electrode pads, and
   wherein each of the second sub-electrode pads has a length ranging from 0.05 mm to 0.5 mm in the direction perpendicular to the electrode lines, and each of the second sub-electrode pads has a width ranging from 0.4 mm to 0.8 mm in the direction parallel to the electrode lines.

6. The solar module according to claim 5, wherein each of the second sub-electrode pads has a length ranging from 0.1 mm to 0.45 mm in the direction perpendicular to the electrode lines, and wherein each of the second sub-electrode pads has a width ranging from 0.45 mm to 0.75 mm in the direction parallel to the electrode lines.

7. The solar module according to claim 1, wherein a width of the busbar is the same as a width of each of the fingers.

8. The solar module according to claim 1, wherein:
   widths of each of the fingers are in a range from 20 μm to 30 μm; and
   a number of the fingers ranges from 135 to 150.

9. The solar module according to claim 1, wherein the diameter of each of the electrode lines ranges from 0.22 mm to 0.28 mm.

10. The solar module according to claim 1, wherein a width of the busbar ranges from 30 μm to 40 μm.

11. The solar module according to claim 1, wherein the solar cell substrate is a P-type substrate or an N-type substrate.

12. The solar module according to claim 11, wherein the solar cell substrate is the P-type substrate, and the busbar on the rear surface is provided with second electrode pads, and a number of the second electrode pads ranges from 6 to 12, lengths of the second electrode pads are 1.5 mm, and widths of each of the second electrode pads are in a range from 2 mm to 3 mm.

13. The solar module according to claim 12, wherein the solar cell substrate is the N-type substrate, and the busbar on the rear surface is provided with second electrode pads, a number of the second electrode pads ranges from 10 to 12, lengths of the second electrode pads ranges from 0.5 mm to 0.8 mm, and widths of the second electrode pads ranges from 0.5 mm to 1.2 mm.

14. The solar module according to claim 13, wherein lengths of the second electrode pads ranges from 0.6 mm to 0.7 mm, and widths of the second electrode pads ranges from 0.6 mm to 1.1 mm.

15. The solar module according to claim 1, wherein the solar module further comprises a first adhesive film material and a second adhesive film material, the solar cells are located between the first adhesive film material and the second adhesive film material, and the first adhesive film material and/or the second adhesive film material has an area density ranging from 310 g/m2 to 430 g/m2.

16. The solar module according to claim 1, wherein each of the first electrode pads has a shape including rectangular shape, diamond shape, circular shape, oval shape, and triangular shape or a combination thereof.

* * * * *

UNITED STATES PATENT AND TRADEMARK OFFICE
CERTIFICATE OF CORRECTION

| | | |
|---|---|---|
| PATENT NO. | : 11,949,027 B2 | Page 1 of 1 |
| APPLICATION NO. | : 17/988319 | |
| DATED | : April 2, 2024 | |
| INVENTOR(S) | : Zhiqiu Guo et al. | |

It is certified that error appears in the above-identified patent and that said Letters Patent is hereby corrected as shown below:

On the Title Page

Column 1, Line 2, under (Assignees), delete "TINKO" and insert --JINKO--.

In the Specification

In Column 11, Line 1, delete "$x^{-11.134}+1.7$." and insert --$x^{-1.134}+1.7$.--.

Signed and Sealed this
Thirteenth Day of May, 2025

Coke Morgan Stewart
*Acting Director of the United States Patent and Trademark Office*